US009551733B2

(12) United States Patent
Bankeström

(10) Patent No.: US 9,551,733 B2
(45) Date of Patent: Jan. 24, 2017

(54) METHOD AND APPARATUS FOR DETECTING A CURRENT IN A ROTATING SYSTEM

(71) Applicants: AKTIEBOLAGET SKF, Göteborg (SE); Olle Bankeström, Västra Frölunda (SE)

(72) Inventor: Olle Bankeström, Västra Frölunda (SE)

(73) Assignee: AKTIEBOLAGET SKF, Gothenburg (SE)

( * ) Notice: Subject to any disclaimer, the term of this patent is extended or adjusted under 35 U.S.C. 154(b) by 103 days.

(21) Appl. No.: 14/360,460

(22) PCT Filed: Nov. 7, 2012

(86) PCT No.: PCT/SE2012/000179
§ 371 (c)(1),
(2) Date: May 23, 2014

(87) PCT Pub. No.: WO2013/077795
PCT Pub. Date: May 30, 2013

(65) Prior Publication Data
US 2014/0320109 A1    Oct. 30, 2014

(30) Foreign Application Priority Data

Nov. 23, 2011 (SE) ..................... 1100867

(51) Int. Cl.
*G01R 19/00* (2006.01)
*G01M 13/04* (2006.01)
(Continued)

(52) U.S. Cl.
CPC ........... *G01R 19/0092* (2013.01); *F03D 17/00* (2016.05); *F16C 19/52* (2013.01); *G01M 13/04* (2013.01);
(Continued)

(58) Field of Classification Search
CPC . F03D 11/0091; G01R 19/0092; G01R 31/343
See application file for complete search history.

(56) References Cited

U.S. PATENT DOCUMENTS 3,961,199 A * 6/1976 Bronicki ............... F02B 37/005
                                                    123/179.14
6,300,701 B1   10/2001 Ong
(Continued)

FOREIGN PATENT DOCUMENTS

CN          1991326 A     7/2007
CN        101008374 A     8/2007
(Continued)

OTHER PUBLICATIONS

Raymond Ong, Dynmond J H, Findlay R D; "A comparison of techniques for measurement of shaft currents in rotating machines;" IEEE Transactions on energy conversion; 12; 4.
(Continued)

*Primary Examiner* — Jeff Natalini
(74) *Attorney, Agent, or Firm* — Bryan Peckjian; SKF USA Inc. Patent Dept.

(57) ABSTRACT

A method of detecting an electric current through a main bearing of a rotating system comprising: a hub; a plurality of blades connected to the hub; at least one electrical motor arranged at the hub; a main shaft attached to the hub and enclosing cabling for providing electrical power to the at least one electrical motor; a bearing housing attached to a metallic structure acting as electrical earth; and a main bearing having an inner ring attached to the main shaft and an outer ring attached to the bearing housing, the method comprising the steps of: providing a first measurement device for determining a measure indicative of an electric current in the main shaft at a first location on a side of the main bearing facing the hub; providing a second measurement device for determining a measure indicative of an (Continued)

electric current in the main shaft at a second location on a side of the main bearing facing away from the hub; determining a measure indicative of a difference between a first current flowing through the main shaft at the first location and a second current flowing through the main shaft at the second location, the difference being indicative of the electric current through the main bearing.

10 Claims, 2 Drawing Sheets

(51) Int. Cl.
*G01R 31/34* (2006.01)
*F16C 19/52* (2006.01)
*G01R 31/42* (2006.01)

(52) U.S. Cl.
CPC .......... *G01M 13/045* (2013.01); *G01R 31/343* (2013.01); *F16C 2233/00* (2013.01); *F16C 2360/31* (2013.01); *G01R 31/42* (2013.01); *Y02E 10/722* (2013.01); *Y02E 10/725* (2013.01)

(56) References Cited

U.S. PATENT DOCUMENTS

| | | | |
|---|---|---|---|
| 7,081,696 B2 * | 7/2006 | Ritchey | H02K 7/108 310/112 |
| 8,229,682 B2 | 7/2012 | El-Refaie | |
| 2008/0315584 A1 * | 12/2008 | Rozman | H02P 1/46 290/34 |
| 2010/0134935 A1 * | 6/2010 | Ritter | F03D 9/003 361/55 |
| 2010/0287909 A1 * | 11/2010 | Bellis | B64C 11/38 60/39.162 |
| 2011/0133743 A1 * | 6/2011 | Barton | F03D 11/0091 324/415 |
| 2012/0139552 A1 * | 6/2012 | Cheng | G01S 19/51 324/512 |
| 2013/0010505 A1 * | 1/2013 | Bo | H02J 3/386 363/37 |

FOREIGN PATENT DOCUMENTS

| | | |
|---|---|---|
| CN | 101400890 A | 4/2009 |
| CN | 101995433 A | 3/2011 |
| DE | 4441828 A1 | 6/1995 |
| GB | 2259150 A | 3/1993 |
| JP | 2005-151749 A | 6/2005 |
| JP | 2005151749 A | 6/2005 |
| WO | 2011010664 A1 | 1/2011 |

OTHER PUBLICATIONS

Raymond Ong, Dynmond J H, Raymond D Findlay, Barna Szabados; "Shaft Current in AC Induction Machine—An Online Monitoring System and Prediction Rules;" IEEE Transactions on Industry applications; 37,4.

\* cited by examiner

METHOD AND APPARATUS FOR DETECTING A CURRENT IN A ROTATING SYSTEM

CROSS-REFERENCE

This application is the US national stage of International Application No. PCT/SE2012/000179 filed on Nov. 7, 2012, which claims priority to Swedish Patent Application No. SE1100867-9 filed Nov. 23, 2011.

TECHNICAL FIELD OF THE INVENTION

The present invention relates to large-scale rotating systems. In particular, the present invention relates to a method and a system for determining an electrical stray current in such a large-scale rotating system.

TECHNICAL BACKGROUND

Large-scale rotating systems with blades connected to a main shaft have been used for a long time for, for example a field of technology with large-scale rotating systems is the field of horizontal axis wind turbines. It is known to control the pitch (longitudinal rotational state) of the blades during operation in order to optimize the efficiency of operation of the rotating system.

In rotating systems such as wind turbines, the main bearing, which connects the main shaft with a fixed structure—the nacelle in a wind turbine—is subjected to substantial and varying forces during operation.

In order to improve the availability/up-time and life span of, for example, a wind turbine, various bearing related parameters may be monitored, such as, for example, vibrations, lubricant pressure, lubricant quality, lubricant temperature and bearing load Although the monitoring that is currently described in the art helps the scheduling of maintenance and prediction of failures before they occur, and thereby may improve the availability of wind turbines and other similar rotating systems, failure modes that are not detected in time may still exist.

SUMMARY OF THE INVENTION

In view of the above-mentioned desired properties of for example a wind turbine, it is an object of the present invention to provide an improved method for determining a bearing related parameter.

According to a first aspect of the present invention, it is therefore provided a method of detecting an electric current through a main bearing of a rotating system comprising: a hub; a plurality of blades connected to the hub; at least one electrical motor arranged at the hub; a main shaft attached to the hub and enclosing cabling for providing electrical power to the at least one electrical motor; a bearing housing attached to a metallic structure acting as electrical earth; and a main bearing having an inner ring attached to the main shaft and an outer ring attached to the bearing housing, the method comprising the steps of: providing a first measurement device for determining a measure indicative of an electric current in the main shaft at a first location on a side of the main bearing facing the hub; providing a second measurement device for determining a measure indicative of an electric current in the main shaft at a second location on a side of the main bearing facing away from the hub; determining a measure indicative of a difference between a first current flowing through the main shaft at the first location and a second current flowing through the main shaft at the second location, the difference being indicative of the electric current through the main bearing.

The current invention is based on the realization that bearing currents may occur in the main bearing supporting the main shaft in a rotating system.

It is known that voltages generated on the shaft of an electrical machine may lead to discharge currents running from the shaft through the bearings connected to the shaft. Such discharge currents may in turn lead to spark tracks, pitting and welding in the bearing rings or in the rolling elements, thereby damaging the bearing. Eventually, discharge currents may lead to the breakdown of the bearing.

The shaft voltage in an electrical machine such as a motor is typically attributed to a "variable frequency drive" (VFD) providing the possibility to adjust the speed of the machine through a pulse width modulated (PWM) AC voltage of variable frequency. The switching of the VFD may lead to a discharge of the parasitic capacitance located between the rotor and the stator of the electrical motor, which induces a voltage on the rotor shaft.

As bearing currents present a well-known problem, bearings used in electrical machines are typically grounded in order to avoid discharge currents.

As the main bearing in a rotating system is not necessarily a part of a motor, a buildup of charge in the main shaft is not expected in such a system. Thus, no current should pass through the main bearing.

However as the main shaft in a rotating system may enclose cabling for providing electrical power to one or more electrical motors arranged at the hub, a part of the current may take a different path outside of the cabling. A reason for this may for example be that equipment installed in the hub may have a capacitive coupling to the hub and/or to the shaft. Furthermore, there may be a ground potential depending on the configuration of the ground conductor at the hub. Accordingly, the shaft voltage may result in an electric current running through the bearing to ground. The shaft may be resistively and/or capacitively coupled to the bearing, leading to either a resistive current through the bearing or to capacitive buildup of charge resulting in a discharge current. Furthermore, as the system controlling the pitch motors may be a switched system powering the pitch engines using a switched bias coupling capacitively to ground, currents having high frequency overtones may flow through the bearing. Such overtones may be more damaging to the bearing compared to currents having lower frequencies as the impedance of the capacitive coupling from, the shaft to the bearing and from the bearing to ground is reduced with increasing frequency.

Accordingly, the inventor has realized that it is desirable to measure the electric current running through a main bearing also in the case where the bearing is not arranged as a part of an electrical motor.

The main bearing supporting the main shaft is comprised in a bearing housing which is coupled to a metallic structure coupled to ground, Accordingly, by measuring a parameter indicative of the electric current in the main shaft at two locations on respective side of the main bearing, and by determining the difference between the two parameters indicative of current, any observed difference between the two shaft currents represents the amount of current running through the bearing.

The main bearing should in the present context be understood as any type of bearing suitable for use in a rotating system such as a single or double row tapered roller bearing, a cylindrical roller bearing, a spherical roller bearing or a ball bearing. The bearing may further comprise a cage or a plurality of cages arranged between the outer and inner ring for keeping the rolling elements in place. The cage may for example be made from a metallic material such as brass or steel, or from a polymer such as polyether ether ketone polymer (PEEK) or a similar polymer based material.

According to one embodiment of the invention, each of the first and second measurement device may be a coil arranged around the main shaft for determining an electric current running through the main shaft.

By arranging a coil around the main shaft, a change in the electric current through the main shaft will give rise to a voltage in the coil. An air-cored coil such as a Rogowski type coil may advantageously be used. The coil is placed around the main shaft in a toroidal fashion so that alternating magnetic field produced by the current induces a voltage in the coil. The voltage is integrated to produce a waveform representing the electric current in the main shaft. Thereby, a first and a second waveform is produced and by taking the difference of the two waveforms, the electric current through the bearing may be deduced. However, it is equally possible to first take the difference between the two voltages induced in the coil and to then integrate the resulting voltage-difference in order to deduce the electric current through the bearing. An advantage of using a coil for measuring the electric current is that it may be arranged around the main shaft without interfering with other parts of the rotating system. Furthermore, by using a Rogowski-type coil which is open ended, integration of the coils in existing systems is greatly simplified. However, any type of coil able to detect current which may be arranged around the main shaft is feasible.

Additionally, as there is no contact between the coils and any moving parts, there is no wear on the components and the required maintenance is therefore kept at a minimum.

However, the method of detecting an electric current may also be performed using a contact type measurement device for measuring the potential in the shaft, such as for example a volt meter or an oscilloscope connecting to the shaft through a slip ring or a brush contact.

According to one embodiment of the invention, the at least one electrical motor arranged at the hub may be a pitch control motor arranged at the hub and configured to control a pitch of at least one of said blades.

The determination of the electric current through the main bearing may yield additional information as the electric current through the bearing is related to the electric current flowing through the cables in the main shaft controlling the electrical motors. For example, in the case where the electrical motors are pitch control motors, the frequency profile of the detected electric current may be indicative of a state of the pitch control motors. Also, different running modes and wind conditions may be indentified through analysis of the electric current through the main bearing.

In one embodiment of the invention, the method may further comprise the step of: providing, if the difference indicative of the electric current through the main bearing is greater than a predefined threshold, a signal indicative of detection of current flow through the main bearing.

It may be desirable to only provide a signal indicative of current through the bearing if the electric current exceeds a certain threshold value, for example if noise is present of if a low constant current which may be harmless is flowing through the bearing.

Furthermore, in one embodiment of the invention, the method may further comprise the step of: providing, if the difference indicative of the electric current through the main bearing is greater than a predefined threshold, a signal indicative of the amount of current flowing through the main bearing.

It may be desirable to know the specific amount of current flowing through the bearing. This may for example be achieved by knowing the sensitivity of the measurement device or by calibrating the measurement according to a known reference current. The determined amount of current may be used to determine whether an electric current breakthrough has occurred in the bearing or if constant current levels are changing.

According to a second aspect of the invention, it is provided a measurement system for detecting an electric current through a main bearing of a rotating system comprising: a hub; a plurality of blades connected to the hub; at least one electrical motor arranged at the hub; a main shaft attached to the hub and enclosing cabling for providing electrical power to the at least one electrical motor; a bearing housing attached to a metallic structure acting as electrical earth; and a main bearing having an inner ring attached to the main shaft and an outer ring attached to the bearing housing, the measurement system comprising: a first measurement device for determining a measure indicative of an electric current in the main shaft for being arranged at a first location on a side of the main bearing facing the hub; a second measurement device for determining a measure indicative of an electric current in the main shaft for being arranged at a second location on a side of the main bearing facing away from the hub; and a control unit configured to receive the parameter indicative of an electric current from the first and second measurement device and determine a measure indicative of a difference between a first current flowing through the main shaft at the first location and a second current flowing through the main shaft at the second location.

In one embodiment of the invention, the first coil may be attached to the outer ring on a side of the main bearing facing the hub and the second coil may be attached to the outer ring on a side of the main bearing facing the hub.

Moreover, the first coil may be integrated in the outer ring on a side of the main bearing facing the hub and the second coil may be integrated in the outer ring on a side of the main bearing facing the hub.

It may be advantageous so arrange the coils in close proximity of the bearing through which the electric current is to be measured. Furthermore, bearings having an integrated measurement system may be provided if coils are attached to or integrated in the bearing, advantageously on or integrated in the outer ring. The coils may for example be arranged in recesses, trenches or grooves located on the sides of the outer ring facing the axial direction of the bearing and the shaft. Alternatively, the coils may be arranged in recesses, trenches or grooves located on the outer side of the outer ring facing in a radial direction of the bearing.

Further effects and features of this second aspect of the present invention are largely analogous to those described above in connection with the first aspect of the invention.

According to a third aspect of the present invention, it is provided a method of detecting an electric current through a main bearing of a rotating system comprising: a hub; a plurality of blades connected to the hub; at least one electrical motor arranged at the hub; a main shaft attached to the hub and enclosing cabling for providing electrical power to the at least one electrical motor; a bearing housing attached to a metallic structure acting as electrical earth; and a main bearing having an inner ring attached to the main shaft and an outer ring attached to the bearing housing, the method comprising the steps of: providing a coil around a portion of the bearing housing defining an electrical connection between the bearing housing and the fixed structure; determining a measure indicative of an electric current flowing through the portion of the bearing housing.

By providing a single coil around a portion of the bearing housing defining the electrical connection between the bearing and ground, it is possible to measure the electric current passing through the bearing by using only one coil for measuring the electric current. If only path from the bearing to ground exits, the measured current equals the electric current through the bearing. Alternatively, if two or more current paths exist, such as if the bearing housing has two or more supports coupling the bearing housing to the surrounding structure, the amount of current flowing through the bearing may be determined by measuring the current flowing through one of current paths if the conducting properties of the other current paths are known. The most straightforward arrangement would be where two or more supports connecting the bearing housing to the fixed structure are symmetric, then it would be possible to measure the electric current through one of the supports and simply multiply that current by the number of supports in order to get the current flowing through the bearing.

In an alternative embodiment, a single coil may be integrated in a cage containing each rolling element. By incorporating a coil in each cage it is possible to determine the electric current between each rolling element. Thereby, in the case of a constant current or a discharge through the bearing, it may be possible to determine at which specific rolling element the electric current transport takes place. Alternatively, in a double row bearing, it is possible to determine at which side the electric current transport takes place. Knowing the specific location of the electric current transport may be very helpful in determining the source of failure in case of a bearing failure. Furthermore, by knowing the specific location of the electric current transport, maintenance may be planned prior to breakdown of the entire bearing, thereby improving the reliability of the entire rotating system. Moreover, each coil enclosing a corresponding rolling element may be connected to an active or passive RFID circuit transmitting a signal identifying the specific rolling element, combined with a receiver configured to receive signals transmitted by the passive circuit. Alternatively, the readout may be performed by using a passive circuit which is powered by the electric current flowing through each specific rolling element, thereby a signal may be sent only when an electric current flowing through the rolling element induces sufficient power in the passive circuit to transmit a signal.

Further effects and features of this third aspect of the present invention are largely analogous to those described above in connection with the first and second aspects of the invention.

According to a fourth aspect of the present invention it is provided a measurement system for detecting an electric current through a main bearing of a rotating system comprising: a hub; a plurality of blades connected to the hub; at least one pitch control motor arranged at the hub for controlling a pitch of at least one of the blades; a main shaft attached to the hub and enclosing cabling for providing electrical power to the at least pitch control motor; a bearing housing attached to a metallic structure acting as electrical earth; and a main bearing having an inner ring attached to the main shaft and an outer ring attached to the bearing housing, the measurement system comprising: a coil arranged around a portion of the bearing housing defining an electrical connection between the bearing housing and the fixed structure and configured to determine a measure indicative of an electric current flowing through the portion of the bearing housing. Effects and features of this fourth aspect of the present invention are largely analogous to those described above in connection with the other aspects of the invention.

Furthermore, it is provided a bearing for a main shaft in a rotating system, the bearing comprising an inner ring, an outer ring, and a plurality of rolling elements arranged between the inner and the outer ring, wherein a first coil for measuring current is arranged on a first side of and adjacently to the outer ring and a second coil for measuring current is arranged on a second side opposite to the first side of and adjacently to the outer ring, and wherein the first and second coils are configured to be connected to a control unit for detecting a voltage induced in each of the coils.

Having coils for measuring current arranged on or integrated in the bearing may be advantageous in applications where a bearing essentially replaces the main shaft, thereby making it difficult to arrange coils separate from the bearing. Alternatively, in applications where no main shaft is present, it may be desirable to measure a current flowing through the bearing, which may be done by integrating coils in or on both sides of the outer ring of the bearing as described above. The sides of the bearing are defined in an axial direction in relation to the rotational axis of the bearing.

BRIEF DESCRIPTION OF THE DRAWINGS

These and other aspects of the present invention will now be described in more detail, with reference to the appended drawings showing embodiments of the invention, wherein.

DETAILED DESCRIPTION OF A PREFERRED EMBODIMENT OF THE INVENTION

In the present detailed description, various embodiments of a measurement method and system for detecting an electric current according to the present invention are mainly discussed with reference to the electric current through a main bearing connected to the main shaft in a wind turbine. It should be noted that this by no means limits the scope of the present invention which is equally applicable to any bearing connected to a shaft in a rotating system such as for example for a propelling shaft in a ship.

Figure 1:
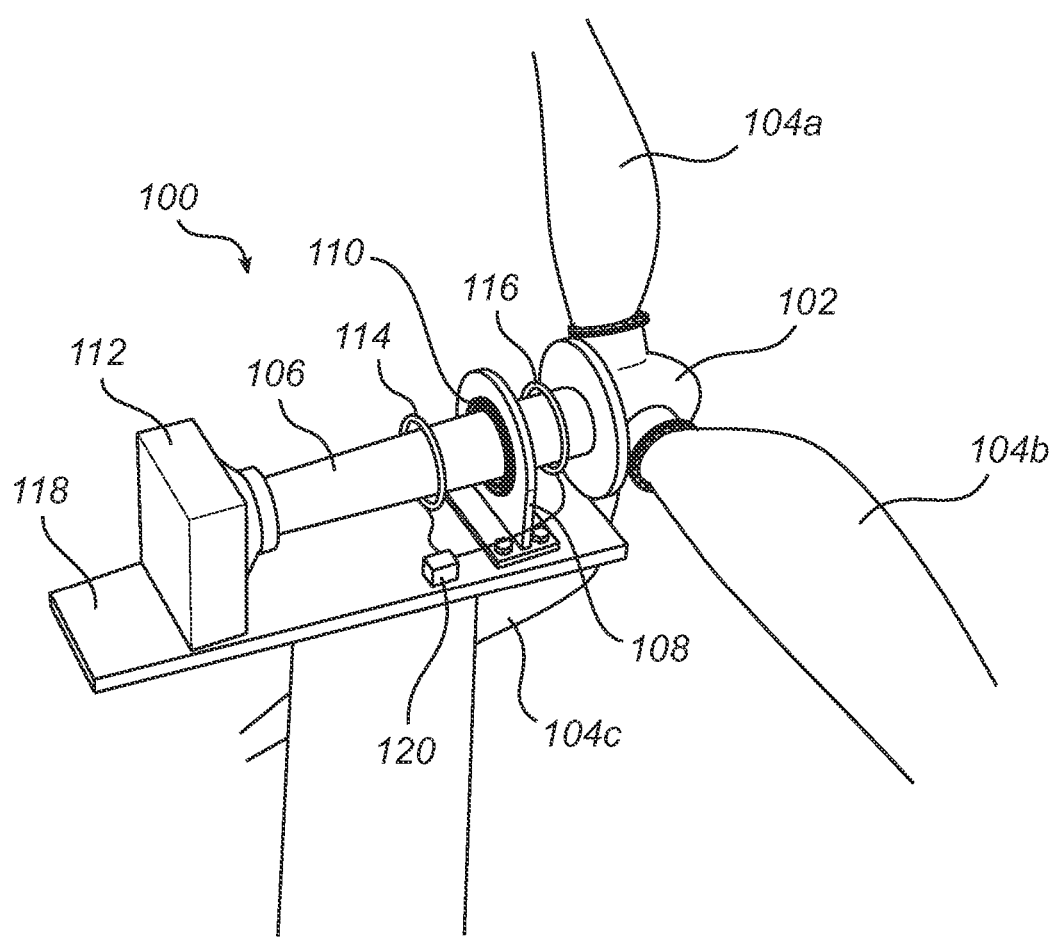
FIG. 1 schematically illustrates an exemplary wind turbine according to an embodiment of the present invention.

FIG. 1 schematically illustrates portions of a wind turbine 100 where a measurement method and system according to embodiments of the present invention may be used. The wind turbine illustrated in FIG. 1 a hub 102, a plurality of blades 104a-c connected to the hub 102, at least one pitch control motor (not shown) arranged at the hub 102 for controlling the pitch of the blades 104a-c, a main shaft 106 attached to the hub 102 and enclosing cabling for providing electrical power to the pitch control motors, a bearing housing 108 attached to a metallic structure 118 acting as electrical earth, and a main bearing 110 having an inner ring attached to the main shaft 106 and an outer ring attached to the bearing housing 108.

A measurement system for detecting an electric current through a main bearing of a rotating system is here shown comprising a first and a second measurement device, each in the form of a coil for measuring current, 114 and 116 arranged around the main shaft 106 on either side of the main bearing 110. Both coils 114 and 116 are electrically connected to a control unit 120 and the coils may for example be Rogowski-type coils. An alternating current in the main shaft 106 will induce a voltage in the coils 114 and 116 as the voltage induced in a coil is proportional to the derivative of the electric current in the main shaft 106. The voltage induced in the coils detected by the control unit 120 where it is integrated in order to represent the electric current through the main shaft 106 in the form of a waveform. Next, the control unit 120 determines the difference between the two waveforms, and that difference is the electric current flowing from the main shaft 106 to ground via the main bearing 110.

The control unit 120 may include a microprocessor, microcontroller, programmable digital signal processor or another programmable device. The control unit 120 may also, or instead, include an application specific integrated circuit, a programmable gate array or programmable array logic, a programmable logic device, or a digital signal processor. Where the control unit 120 includes a programmable device such as the microprocessor, microcontroller or programmable digital signal processor mentioned above, the processor may further include computer executable code that controls operation of the programmable device.

Figure 2:
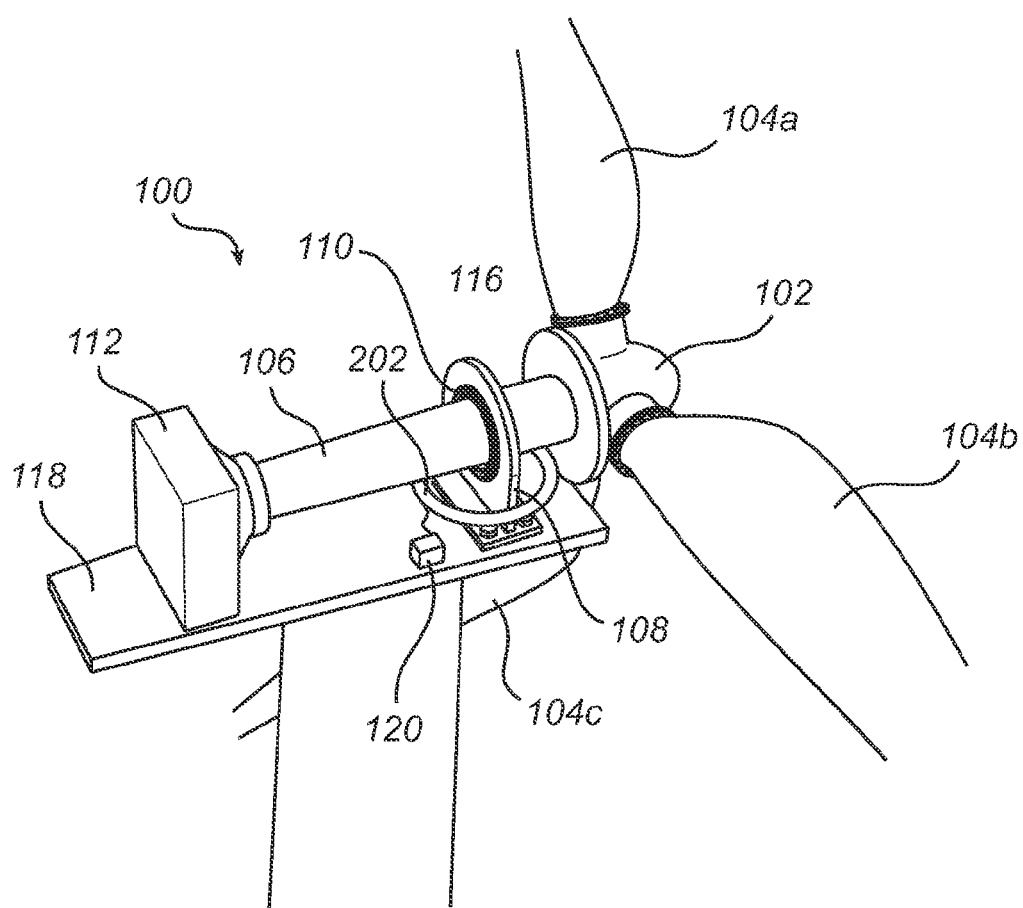
FIG. 2 schematically illustrates an exemplary wind turbine according to an embodiment of the present invention.

FIG. 2 illustrates an alternative embodiment of the invention wherein a measurement device in the form of a coil 202 for measuring current is arranged around the bearing housing 108 at the point where the bearing housing is connected to the support structure. In the case where the main bearing 110 is connected through ground via a single conductive path as via the bearing housing 108 shown in FIG. 2, it is possible to detect the electric current flowing through the main bearing 110 by arranging a single coil 202 around the bearing housing 108. A waveform representing the electric current through the bearing is thus formed by integrating the voltage generated in the coil 202. In the same manner, if the bearing housing is connected to the support structure via two or more support points, a coil may be arranged around each of the support points in order to measure the current flowing through the bearing to ground.

Figure 3:
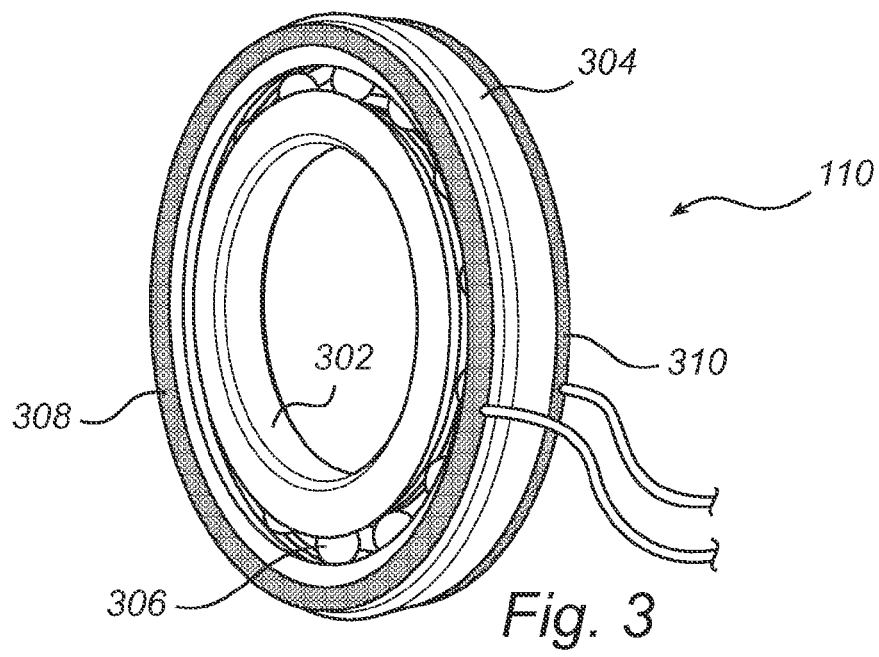
FIG. 3 schematically illustrates a bearing according to an embodiment of the present invention.

FIG. 3 is a schematic illustration of a main bearing 110 having an inner ring 302, an outer ring 304 and a plurality of rolling elements 306. The bearing may of course be any type of bearing suitable for the specific application at hand. In the embodiment of the invention illustrated in FIG. 3, first and second coils 308 and 310 for measuring currents are arranged on either side of the outer ring 304 of the main bearing 110. The two coils may be connected to a control unit and the electric current through the bearing may be determined in a similar manner as described above The person skilled in the art realizes that the present invention by no means is limited to the preferred embodiments described above. For example, even though the embodiments disclosed above relates to the detection of AC current in a main shaft in a wind turbine application, it is equally possible to provide measurement devices for detecting direct currents in a main shaft for example in a marine application. Although pitch control is used in many ships, stray current issues for ships may more often be related to the use of dissimilar materials in an electrolyte (sea water).

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method of detecting an electric current through a main bearing of a rotating system comprising:
   a hub;
   a plurality of blades connected to the hub;
   at least one electrical motor arranged at the hub;
   a main shaft attached to the hub and enclosing cabling for providing electrical power to said at least one electrical motor arranged at the hub;
   a bearing housing attached to a metallic structure acting as electrical earth; and
   a main bearing having an inner ring attached to the main shaft and an outer ring attached to the bearing housing, said method comprising:
   determining a first measure indicative of an electric current in said main shaft at a first location on a side of said main bearing facing said hub;
   determining a second measure indicative of an electric current in said main shaft at a second location on a side of said main bearing facing away from said hub; and
   determining a third measure indicative of said electric current through said main bearing,
   wherein determining the third measure comprises determining a difference between the first measure and the second measure.

2. The method according to claim 1, wherein determining a first measure comprises providing a first measurement device and determining a second measure comprises providing a second measurement device and wherein each of said first and second measurement device is a coil arranged around said main shaft for determining an electric current running through said main shaft.

3. The method according to claim 2, wherein said at least one electrical motor arranged at the hub is a pitch control motor arranged at the hub and configured to control a pitch of at least one of said blades.

4. The method according to claim 1, further comprising:
   providing, if said difference is greater than a predefined threshold, a signal indicative of detection of current flow through said main bearing.

5. The method according to claim 1, further comprising:
   providing, if said difference is greater than a predefined threshold, a signal indicative of the amount of current flowing through said main bearing.

6. A measurement system for detecting an electric current through a main bearing of a rotating system comprising:
   a hub;
   a plurality of blades connected to the hub;
   at least one electrical motor arranged at the hub;
   a main shaft attached to the hub and enclosing cabling for providing electrical power to said at least one electrical motor arranged at the hub;
   a bearing housing attached to a metallic structure acting as electrical earth; and
   a main bearing having an inner ring attached to the main shaft and an outer ring attached to the bearing housing, said measurement system comprising:
a first measurement device configured to determine a first measure indicative of an electric current in said main shaft at a first location on a side of said main bearing facing said hub;
a second measurement device configured to determine a second measure indicative of an electric current in said main shaft at a second location on a side of said main bearing facing away from said hub; and
a control unit configured to receive said first measure and said second measure from said first measurement device and said second measurement device and to determine a third measure indicative of said electric current through said main bearing,
wherein said third measure is indicative of a difference between the first measure and the second measure.

7. The measurement system according to claim 6, wherein each of said first and second measurement device is a coil arranged around said main shaft for determining said current running through said main shaft.

8. The measurement system according to claim 7, wherein said first coil is attached to said outer ring on a side of said main bearing facing said hub and said second coil is attached to said outer ring on a side of said main bearing facing away from said hub.

9. The measurement system according to claim 7, wherein said first coil is integrated in said outer ring on a side of said main bearing facing said hub and said second coil is integrated in said outer ring on a side of said main bearing facing away from said hub.

10. The measurement system according to claim 7, wherein said first coil is arranged in a first recess in said outer ring on a side of said main bearing facing said hub and said second coil is arranged in a first recess in said outer ring on a side of said main bearing facing away from said hub.

* * * * *